United States Patent
Owen

(10) Patent No.: US 9,477,851 B2
(45) Date of Patent: Oct. 25, 2016

(54) LCL HIGH POWER COMBINER

(71) Applicant: MKS Instruments, Inc., Andover, MA (US)

(72) Inventor: Christopher Michael Owen, Pittsford, NY (US)

(73) Assignee: MKS Instruments, Inc., Andover, MA (US)

( * ) Notice: Subject to any disclaimer, the term of this patent is extended or adjusted under 35 U.S.C. 154(b) by 35 days.

(21) Appl. No.: 14/444,133

(22) Filed: Jul. 28, 2014

(65) Prior Publication Data

US 2014/0333390 A1    Nov. 13, 2014

Related U.S. Application Data

(63) Continuation of application No. 13/222,014, filed on Aug. 31, 2011, now Pat. No. 8,791,772.

(60) Provisional application No. 61/380,496, filed on Sep. 7, 2010.

(51) Int. Cl.
  *H01P 3/08*    (2006.01)
  *G06G 7/12*    (2006.01)
  (Continued)

(52) U.S. Cl.
  CPC ............ *G06G 7/12* (2013.01); *H03F 3/189* (2013.01); *H03F 3/195* (2013.01); *H03F 3/24* (2013.01); *H03F 3/602* (2013.01); *H03F 2200/411* (2013.01)

(58) Field of Classification Search
  CPC ......... G06G 7/12; H03F 3/189; H03F 3/195; H03F 3/24; H03F 3/602; H03F 2200/411
  USPC ........................................................ 333/127
  See application file for complete search history.

(56) References Cited

U.S. PATENT DOCUMENTS 3,963,993 A    6/1976   Hoffman et al.
5,206,604 A *  4/1993   Vaninetti .................. H03F 3/602
                                                330/124 R
(Continued)

FOREIGN PATENT DOCUMENTS

DE    WO 2011050898 A1 *  5/2011   ................ H01P 5/10
EP    0677221 A1   10/1995
(Continued)

OTHER PUBLICATIONS

Taiwanese Office Action for Application No. 100131833 dated Oct. 22, 2014, and its English translation thereof.
(Continued)

*Primary Examiner* — Robert Pascal
*Assistant Examiner* — Kimberly Glenn
(74) *Attorney, Agent, or Firm* — Harness, Dickey & Pierce, P.L.C.

(57) ABSTRACT

A combiner includes N coaxial cables each configured to connect to a respective output of N radio frequency power amplifiers, where N is an integer greater than one. Each of the N coaxial cables is configured to receive an amplified radio frequency signal from a respective one of the N radio frequency power amplifiers. A board includes capacitances and is configured to connect to each of the N coaxial cables and combine the radio frequency signals. The N coaxial cables and the capacitances provide N inductance and capacitance combinations. A connector is configured to connect an output of the board to a load.

20 Claims, 2 Drawing Sheets

(51) Int. Cl.
*H03F 3/189* (2006.01)
*H03F 3/195* (2006.01)
*H03F 3/24* (2006.01)
*H03F 3/60* (2006.01)

(56) References Cited

U.S. PATENT DOCUMENTS

| | | | |
|---|---|---|---|
| 5,939,939 A | 8/1999 | Gaynor et al. | |
| 6,252,354 B1 | 6/2001 | Collins et al. | |
| 6,887,339 B1 | 5/2005 | Goodman et al. | |
| 7,764,140 B2 | 7/2010 | Nagarkatti et al. | |
| 7,777,567 B2 | 8/2010 | Polizzo | |
| 7,839,223 B2 | 11/2010 | Van Zyl et al. | |
| 8,912,864 B2 * | 12/2014 | Morgenstern | H01P 5/10 333/127 |
| 2003/0117231 A1 | 6/2003 | Gerlock | |
| 2004/0140863 A1 | 7/2004 | Ammar | |
| 2007/0063791 A1 | 3/2007 | Wu et al. | |
| 2008/0204134 A1 | 8/2008 | Knickerbocker et al. | |

FOREIGN PATENT DOCUMENTS

| | | |
|---|---|---|
| JP | 55-015881 | 4/1980 |
| JP | 57-136812 A | 8/1982 |
| JP | 60-254477 A | 5/1984 |
| WO | 2009067054 A1 | 5/2009 |

OTHER PUBLICATIONS

Chinese Office Action for Application No. 201180042373.X dated Nov. 15, 2014, and its English translation thereof.
English Translation of Japanese Office Action for Application No. 2013-527370 dated Mar. 10, 2015.
Chinese Decision of Rejection for Application No. 201180042373.X dated Jun. 12, 2015, and its English translation thereof.
English translation of Japanese Office Action for Application No. 2013-527370 dated Sep. 15, 2015.
Randy Heckman, Gregory Roche & James R. Usher, "The Evolution of RF Power Delivery in Plasma Processing", Advanced Energy Industries, Inc., pp. 1-8, Fort Collins, Colorado, 1998.
MKS Instruments, Inc., "RF Power Products" catalog, Rochester, New York, 2003.
International Search Report for International Application No. PCT/US2011/050492 dated Feb. 27, 2012.
Extended European Search Report for Application No. 11823999.5, dated Mar. 25, 2014.
Guo, Qingxin, Yanjun Ma, and Jilong Ju. "A Novel Broadband High-Power Combiner." (2005): 1-4. Print.
Chinese Office Action for Application No. 201180042373.X dated Jun. 10, 2014, and its English translation thereof.
English translation of the Notification of Reexamination for Chinese Application No. 201180042373X dated Mar. 16, 2016.
English Translation of Korean Office Action for Application No. 10-2013-7007884, dated Jun. 1, 2016.

* cited by examiner

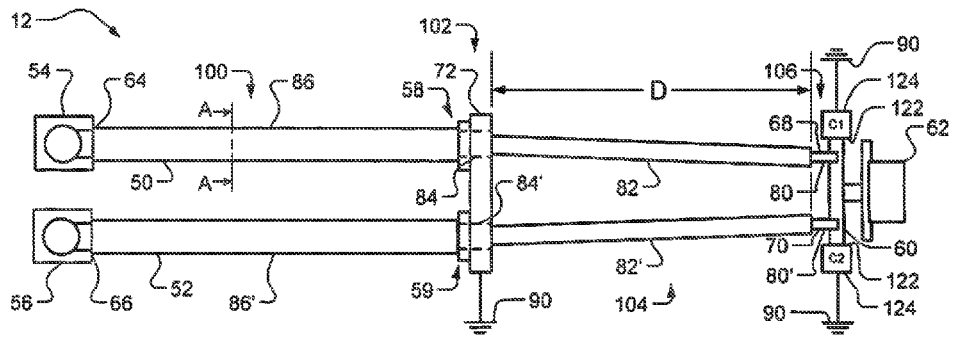
FIG. 2
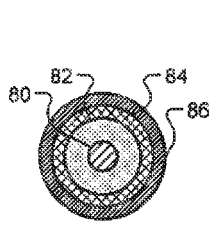
FIG. 3
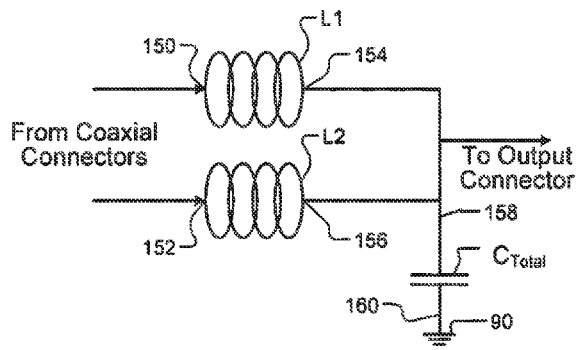
FIG. 4
|  | 2-WAY | | | | 3-WAY | | | 4-WAY | | |
|---|---|---|---|---|---|---|---|---|---|---|
| RF Frequencies | F1 | F2 | F3 | F4 | F2 | F3 | F4 | F2 | F3 | F4 |
| C$_{Total}$ (pF) | TC1 | TC2 | TC3 | TC4 | TC5 | TC6 | TC7 | TC8 | TC9 | TC10 |
| L (nH) | l1 | l2 | l3 | l4 | l5 | l6 | l7 | l8 | l9 | l10 |
| Length D (mm) | D1 | D2 | D3 | D4 | D5 | D6 | D7 | D8 | D9 | D10 |
FIG. 5

LCL HIGH POWER COMBINER

CROSS-REFERENCE TO RELATED APPLICATIONS

This application is a continuation of U.S. patent application Ser. No. 13/222,014 filed on Aug. 31, 2011. This application claims the benefit and priority of U.S. Provisional Application No. 61/380,496 filed on Sep. 7, 2010. The entire disclosures of each of the above applications are incorporated herein by reference.

FIELD

The present disclosure relates to power amplifiers and to combiners of outputs of power amplifiers.

BACKGROUND

This section provides background information related to the present disclosure. This section is not necessarily prior art.

Various industries use combiners to combine amplified signals to increase power supplied to a load. By way of a non-limiting example, a radio frequency (RF) generator may include multiple RF power amplifiers. Power from the RF power amplifiers may be combined by a combiner and provided to a load, such as a plasma chamber. The combined power drives the plasma chamber to fabricate various components such as integrated circuits, solar panels, compact disks (CDs), digital versatile (or video) discs (DVDs), and the like.

In high frequency (HF) and very high frequency (VHF) frequency environments, combiners may include lossy ferrite transformers, transmission lines, isolation devices, etc. The combiners may be isolated or non-isolated, for example, a Wilkinson type combiner, may be an isolated combiner or non-isolated combiner. Another example of a non-isolated transformer is a lossy ferrite transformer operating in a balanced mode. An isolated combiner has inputs that are isolated from each other via, for example, one or more resistors and/or other isolation devices. A non-isolated combiner has inputs that are not isolated from each other.

Combiners have associated parameters, such as form factors, power density levels, heat generation levels, gain matching errors, phase matching errors, etc. The term "form factor" refers to the volume (height, width and depth) and/or envelope of a combiner. The term "power density" refers to power (e.g. kilowatts) per unit area of a combiner. The gain and phase matching errors refer to matching errors between a combiner and a load when the load has a short circuit and/or an open circuit. A particular application of a combiner may have gain, phase and/or impedance matching requirements. Each of the gain, phase and/or impedance matching requirements may include associated matching error limits.

Form factors, complexity and structures of conventional combiners limit (i) the applications and operating environments in which the combiners can be used and (ii) efficiencies, power outputs, etc. of the combiners. As an example, a power generator may have a power density requirement and/or dedicated maximum chassis volume requirements (e.g., maximum height, width and depth requirements). The power generator may include two or more PAs to meet a desired power output. A combiner may be used to combine outputs of the PAs to provide the required power output. However, the combiner may not be usable if the form factor of the combiner and/or of the PAs results in an overall volume of the power generator exceeding the maximum chassis volume.

Also, structural limitations and operating characteristics of typical combiners can require that PAs be combined in even numbers. For example, a power output requirement of a power generator may necessitate the use of 3 PAs. Since an even number of PAs must be used, 4 PAs are incorporated. The 4 PAs are underpowered to meet the required power output. Use of additional PAs increases size, complexity, costs, heat generation, etc. and decreases efficiency and possible applications and operating environments of a power generator.

SUMMARY

A combiner includes N coaxial cables each configured to connect to a respective output of N radio frequency power amplifiers, where N is an integer greater than one. Each of the N coaxial cables is configured to receive an amplified radio frequency signal from a respective one of the N radio frequency power amplifiers. A board includes capacitances and is configured to connect to each of the N coaxial cables and combine the radio frequency signals. The N coaxial cables and the capacitances provide N inductance and capacitance combinations. A connector is configured to connect an output of the board to a load.

In other features, a combiner is provided and includes a first coaxial cable configured to connect to a first output of a first radio frequency power amplifier. The first coaxial cable includes a first non-shielded section with a first inductance. A second coaxial cable is configured to connect to a second output of a second radio frequency power amplifier. The second coaxial cable includes a second non-shielded section with a second inductance. A board includes a first capacitance and a second capacitance. The first capacitance is connected to the first non-shielded section to provide a first inductance and capacitance combination. The second capacitance is connected to the second non-shielded section to provide a second inductance and capacitance combination. The second inductance and capacitance combination is equal to the first inductance and capacitance combination.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The drawings described herein are for illustrative purposes only of selected embodiments and not all possible implementations, and are not intended to limit the scope of the present disclosure.

FIG. 2 is a top view of a combiner in accordance with the present disclosure;

FIG. 3 is a cross-sectional view of a coaxial cable of the combiner of FIG. 2 through a section line A-A;

FIG. 4 is a circuit diagram of a portion of the combiner of FIG. 2; and

FIG. 5 is an example multi-way combiner parameter table in accordance with the present disclosure.

DETAILED DESCRIPTION

Figure 1:
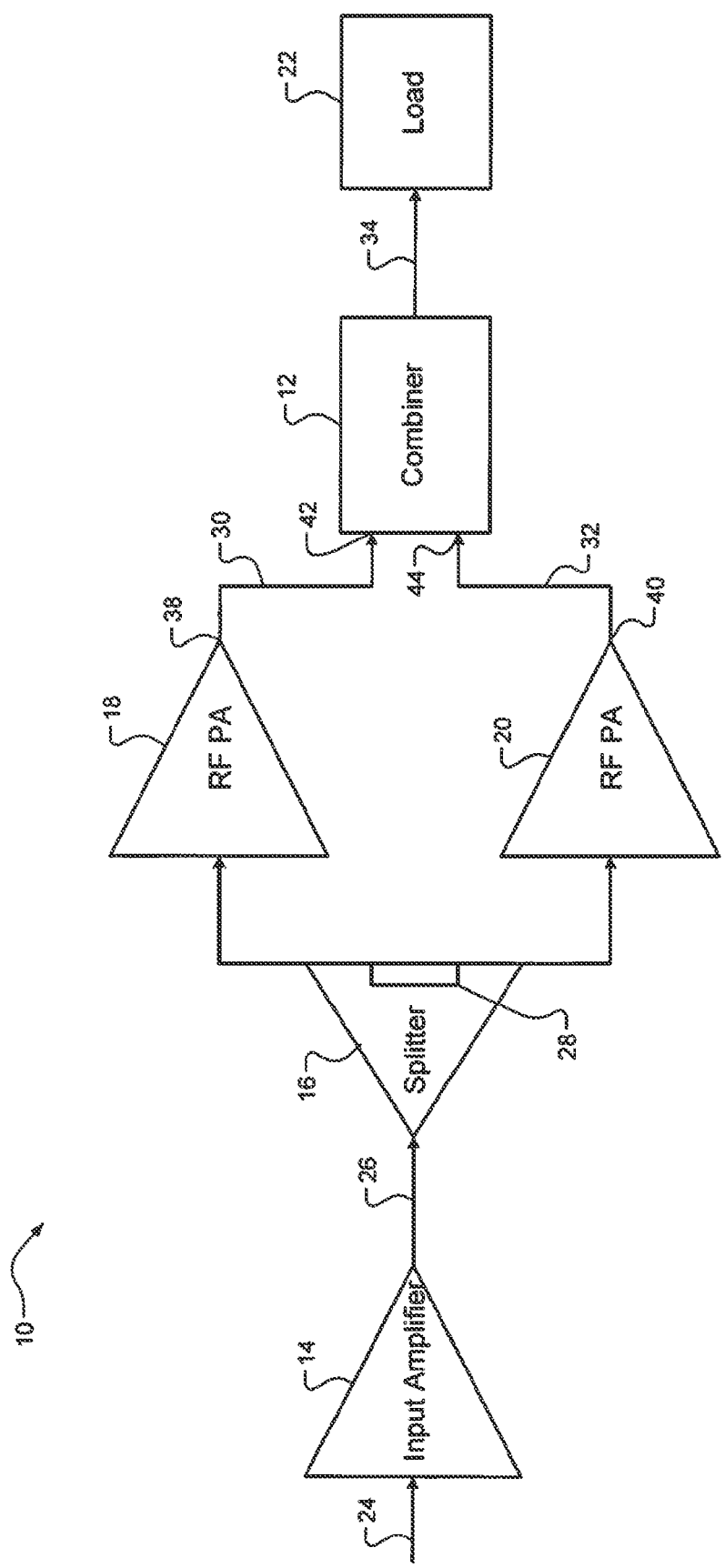
FIG. 1 is a block diagram of a power generator system incorporating a combiner in accordance with the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In FIG. 1, a block diagram of a power generator system 10 incorporating a combiner 12. The power generator system 10 includes an input amplifier 14, a splitter 16, first and second radio frequency (RF) power amplifiers (PAs) 18, 20, the combiner 12 and a load 22 (e.g., a plasma chamber). The input amplifier 14 receives and conditions a RF signal 24 to generate a conditioned signal 26. The input amplifier 14 may include, for example, a pre-amplifier, a driver, etc. The splitter 16 provides the conditioned signal 26 to each of the RF PAs 18, 20. Outputs of the splitter 16 may be isolated from each other via an isolator 28. The isolator 28 may include one or more resistors and/or other isolating devices.

The RF PAs 18, 20 may be high-power amplifiers. By way of a non-limiting example, the RF PAs 18, 20 may each provide power outputs of greater than or equal to 2.5 kilowatts (kW). The RF PAs 18, 20 generate amplified output signals 30, 32 that are in-phase with each other (e.g., each may have a phase of 0°). Although two RF PAs are shown and number of RF PAs may be incorporated. The number of RF PAs may be odd or even.

Although the combiner 12 is described primarily with respect to combine output signals of RF PAs, the combiner 12 may be used to combine output signals of other circuit components. The combiner 12 combines the amplified output signals 30 and 32 of the RF PAs 18, 20 to provide a power generator output signal 34, which is provided to the load 22. The combiner 12 does not provide isolation between output terminals 38, 40 of the RF PAs 18, 20. Inputs 42, 44 of the combiner 12 may impedance match outputs of the RF PAs 18, 20. For example only, output impedance of each of the RF PAs 18, 20 and input impedances of the combiner 12 may each be 50 Ohms ($\Omega$). In addition, output impedance of the combiner 12 may match an input impedance of the load 22. As another example, the output impedance of the combiner 12 and input impedance of the load 22 may each be 50$\Omega$.

In FIG. 2, an example of the combiner 12 of FIG. 1 is shown. The combiner 12 includes two or more coaxial cables 50, 52 (2 are shown). The coaxial cables 50, 52 include coaxial connectors 54, 56, grounding sections 58, 59, a capacitance board 60, and an output connector 62. The coaxial cables 50, 52 have coaxial connector (first) ends 64, 66 and capacitor (second) ends 68, 70. The coaxial connectors 54, 56 (e.g., c-type connectors) are connected to the first ends 64, 66 and to output terminals of RF PAs (e.g., the output terminals 38, 40 of the RF PAs 18, 20). The grounding sections 58, 59 are held by a clamp 72, which is connected to ground 74 (e.g., circuit and/or chassis ground). The clamp 72 may be referred to as a grounding clamp. The clamp 72 may be, for example, connected and/or screwed to a RF deck, which is grounded or connected to a voltage reference. The clamp 72 may be a screw down clamp. The second ends 68, 70 are connected to the capacitance board 60. The capacitance board 60 is connected to the output connector 62, which in turn may be connected to a load (e.g., load 22).

Referring now also to FIG. 3, a cross-sectional view of the first coaxial cable 50 is shown. The second coaxial cable 52 may have the same cross-sectional make up as the first coaxial cable 50. The first coaxial cables 50 may have a core 80 (e.g., a wire), a dielectric insulator 82, a shield 84, and a sheath 86 (designated 80', 82', 84', and 86' respectively for the second coaxial cable 52). The core 80 may be connected to and receive an output signal of one of the RF PAs 18, 20, which may be combined to provide the power output signal 34 at the output connector 22. The dielectric insulator 82 isolates the core 80 from the shield 84. The shield 84 may be, for example, a wire mesh that is exposed and connected to a voltage reference 90 (e.g., a ground reference). The core 80 and the shield 84 may be formed of copper or other conductive materials. The dielectric insulator 82 and the sheath 86 are non-conductive and may be formed of plastic and/or other dielectric materials.

Each of the coaxial cables 50, 52 includes four sections; sheathed sections 100, shielded sections 102, non-shielded sections 104, and core sections 106. The sheathed sections 100 extend from the coaxial connectors 54, 56 to the clamp 72.

The shielded sections 102 extend between the sheathed sections 100 and the non-shielded sections 104, are held by the clamp 72 and are connected to the voltage reference 90. In the shielded sections 102, the sheaths 86, 86' of the coaxial cables 50, 52 are removed to expose the shields 84, 84'. The shields 84, 84' are exposed to contact the clamp 72, which couples the shields 84, 84' to the voltage reference 90.

The non-shielded sections 104 extend from the clamp 72 to the core sections 106. The sheaths 86, 86' and the shields 84, 84' are removed from the non-shielded sections 104 to expose the dielectric insulators 82, 82'. Each of the non-shielded sections 104 performs as a linear inductor in series with a respective one of the connectors 54, 56. Inductance of each of the non-shielded sections 104 is based on a length D of the non-shielded sections 104. The length D may be selected based on the application.

The core sections 106 do not include the sheaths 86, 86', the shields 84, 84' and the dielectric insulators 82, 82'. The core sections 106 extend from the non-shielded sections 104 and are connected to the capacitance board 60. The capacitance board 60 provides a shunt capacitance at the output connector 62 to provide a desired impedance transformation.

The capacitance board 60 may include any number of capacitors (e.g., capacitors C1, C2), which may be connected in parallel and/or in series. First ends 122 of the capacitors may be connected to the cores 80, 80' in the core sections 106. Second ends 124 of the capacitors may be connected to the voltage reference 90. Output of the capacitance board 60 is provided to the output connector 62.

The coaxial cables 50, 52 may have approximately the same dimensions, section lengths, and be formed of the same materials. For example, lengths (and other dimensions) of the sheathed sections 100 may be the same, lengths (and other dimensions) of the shielded sections 102 may be the same, lengths (and other dimensions) of the non-shielded sections 104 may be the same, and lengths (and other dimensions) of the core sections 106 may be the same. This assures that the impedances and inductances of the coaxial cables 50, 52 are approximately the same. As an example, the lengths of the non-shielded sections 104 may be approximately the same (e.g., equal in length, which difference between the lengths not greater than ±1-3 millimeters (mm)), which may match impedances of the non-shielded sections 104 to within, for example, 1Ω.

The coaxial cables 50, 52 are effectively connected in parallel relative to the second ends 68, 70. As a result, the output impedance of the combiner 12 (e.g., 50Ω) is equal to impedance of each inductance and capacitance (LC) combination (e.g., 50Ω) of the combiner 12. An LC combination is provided by each one of the coaxial cables 50, 52 and corresponding capacitances (e.g., C1, C2). For example, a first LC combination is provided by a first non-shielded section of the first coaxial cable 50 and the first capacitance C1. A second LC combination is provided by a second non-shielded section of the second coaxial cable 52 and a second capacitance C2. Although a single capacitor is shown for each of the capacitances C1 and C2, each of the capacitances C1 and C2 may include any number of capacitors.

Each of the LC combinations increases and/or doubles an output impedance of one of the RF PAs 18, 20 (e.g., from 50Ω to 100Ω). As the LC combinations are connected in parallel at the capacitance board 60 and/or at the output connector 62, the output impedance (e.g., 50Ω) of the combiner 12 may be approximately equal to (i.e. match) the output impedance of one of the RF PAs 18, 20. In other words, output impedance of each cable is greater than (or double) the output impedance of each of the RF PAs 18, 20. However, a total output impedance of the combiner 12 may be approximately equal to the output impedance of each of the RF PAs 18, 20. The term "approximately equal" to refers to two values being within a predetermined range of each other and/or equal to each other. As an example, the above-stated impedance values may be within ±1-3Ω of each other.

Referring now also to FIG. 4, a circuit diagram of a portion of the combiner 12 is shown. The combiner 12 is an inductor-capacitor-inductor (LCL) type combiner. Inductances of the non-shielded sections 104 are represented by inductors L1 and L2. Total capacitance of the capacitors (e.g., C1 and C2) of the capacitance board 60 is represented by capacitor $C_{Total}$. The inductors L1 and L2 have input ends 150, 152 and output ends 154, 156. The capacitor $C_{Total}$ has an input end 158 and an output end 160.

The input ends 150, 152 may be connected to the coaxial connectors 54, 56 via the sheathed sections 100. The output ends 154, 156 are connected to the first end 158 of the capacitor $C_{Total}$. The second end 160 of the capacitor $C_{Total}$ is connected to the voltage reference 90. The second end 160 is also connected to the output connector 62.

In FIG. 5, an example multi-way combiner parameter table is shown. The multi-way combiner parameter table provides combiner parameters including total capacitance Total C, non-shielded section inductance L, and non-shielded section length D for various N-way combiners, where N is an integer greater than 1. In the table, F1-F4 are RF frequencies, TC1-TC10 are total capacitance values for capacitance $C_{Total}$, I1-I10 are inductance values for each of inductors L1 and L2, and D1-D10 are length values for length D. Selected total capacitance, inductance and/or length values may decrease relative to an increase in the RF frequency received by the N-way combiners.

The multi-way combiner parameter table provides example parameter values for 2-way, 3-way and 4-way combiners operating at different frequencies. A 2-way combiner refers to a combiner that receives and combines two power outputs from two RF PAs. A 2-way combiner is shown in FIGS. 1, 2 and 4. A 3-way combiner refers to a combiner that receives and combines three power outputs from three RF PAs. A 4-way combiner refers to a combiner that receives and combines four power outputs from four RF PAs. An N-way combiner that receives 3 or more outputs from 3 or more RF PAs may include an additional coaxial cable and corresponding capacitance for each additional RF PA output received. For example, a 3-way combiner may be constructed as the combiner 12 of FIGS. 2 and 4, but include three LC combinations with three coaxial cables instead of two LC combinations with two coaxial cables. The three coaxial cables may be connected effectively in parallel relative to the output connector 62. Any number of coaxial cables and/or LC combinations may be connected to provide a desired power output.

The total capacitance Total C is the capacitance of the capacitance board or the resulting capacitance of the capacitors (e.g., $C_{Total}$) of the LC combinations. The non-shielded section inductance L refers to the inductance of each of the non-shielded sections 104 of the combiner 12. The inductances of each of the non-shielded sections 104 are based on the lengths of the non-shielded sections (e.g., length D). The lengths may be adjusted based on RF frequencies of amplified RF signals received from RF PAs.

Referring again to FIGS. 2 and 4, the inductances (e.g., L1 and L2) of the combiner 12 are provided via the cores 80, 80' of the non-shielded sections 104. The inductances are provided without incorporation of additional connectors, printed circuit boards and additional high power inductors.

In one example implementation, the combiner 12 is used to provide, for example, input and output impedance matching of 50Ω. The input and output impedance matching may be provided such that impedances of each of the inputs and the combined output of the combiner 12 are 50Ω within, for example, ±1Ω. As a result, each output of the RF PAs 18, 20 is connected to a 50Ω load or input impedance of the combiner 12. Also, due to the dimensional, structural and material matching of each of the coaxial cables 50, 52, the combiner 12 provides accurate gain and phase matching (e.g., gain within ±0.1 decibel (dB) and phase within ±3°) between the coaxial cables 50, 52. The phases of the coaxial cables 50, 52 are matched to be combined without signal cancellation.

The matching of each of the coaxial cables 50, 52 of the combiner 12 allows for balanced sharing of power from the RF PAs 18, 20. As a result, gain matching and phase matching errors of the combiner 12 are less than conventional gain and phase matching errors. For example, conventional gain and phase matching errors can be respectively 0.5 dB and 10°, which may be magnified by a load of the combiner 12 when the load has a short or open circuit.

The above-described combiners combine RF power, have minimal sizes and form factors and allow for increased power densities. As the combiners are formed of coaxial cables, coaxial connectors, and a capacitance board the form factor of the combiner is minimized, without use of a mechanical box, ferrites, transformer windings, etc. This allows the combiners and corresponding RF PAs to be incorporated in a smaller space or footprint than conventional RF PA/combiner systems.

Since the structures of the combiners disclosed herein have fewer components and are smaller than conventional high power combiners, the structures are less complex and cost less than conventional high power combiners. By being smaller and less complex, the combiners can be easier to manufacture than conventional combiners. The above-disclosed combiners also minimize RF power loss and increases in temperature during operation, as the combiners do not include ferrite materials and/or ferrite transformers. The above-disclosed combiners also provide increased reliability due to the inclusion of a minimal number of components and structural complexity.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A combiner comprising:
N coaxial cables each configured to connect to a respective output of N radio frequency power amplifiers, where N is an integer greater than one, and wherein each of the N coaxial cables is configured to receive an amplified radio frequency signal from a respective one of the N radio frequency power amplifiers, the N coaxial cables having first and second ends, the N coaxial cables being unconnected at respective first ends;
a board comprising a plurality of capacitances and configured to connect to each of the N coaxial cables and combine the amplified radio frequency signals, wherein the N coaxial cables and the plurality of capacitances provide N inductance and capacitance combinations, wherein the N coaxial cables connect at opposite ends from the first ends; and
a connector configured to connect an output of the board to a load,
wherein at least one of the N coaxial cables includes a non-shielded section, the non-shielded section having an inductance that varies in accordance with a length of the non-shielded section.

2. The combiner of claim 1, wherein the N coaxial cables comprise:
a first coaxial cable configured to connect to a first output of a first one of the N radio frequency power amplifiers; and
a second coaxial cable configured to connect to a second output of a second one of the N radio frequency power amplifiers.

3. The combiner of claim 2, wherein the N coaxial cables further comprise a third coaxial cable configured to connect to a third output of a third one of the N radio frequency power amplifiers.

4. The combiner of claim 1, wherein:
each of the N coaxial cables is connected to a respective one of the plurality of capacitances to provide one of the N inductance and capacitance combinations; and
each of the plurality of capacitances is connected between the N coaxial cables and a voltage reference.

5. The combiner of claim 1, wherein input impedance of each of the N coaxial cables matches output impedance of one of the N radio frequency power amplifiers.

6. The combiner of claim 1, wherein output impedance of the combiner at the connector matches an input impedance of the load.

7. The combiner of claim 1, wherein the N inductance and capacitance combinations are connected in parallel relative to each other.

8. The combiner of claim 7, wherein:
an output impedance of each the N radio frequency power amplifiers is greater than an output impedance of each of the N inductance and capacitance combinations; and the output impedance of each the N radio frequency power amplifiers is equal to a total output impedance of the combiner.

9. The combiner of claim 1, wherein the N coaxial cables are gain and phase matched to each other and equally share in power supplied to the load.

10. A power generator system comprising:
an input amplifier configured to receive a radio frequency signal and generate a conditioned signal;
a splitter configured to split the conditioned signal into a plurality of radio frequency signals;
the N radio frequency power amplifiers configured to amplify the plurality of radio frequency signals to generate the amplified radio frequency signals; and
the combiner of claim 1.

11. A combiner comprising:
N coaxial cables each configured to connect at respective first ends to a respective output of N radio frequency power amplifiers, where N is an integer greater than one, and wherein each of the N coaxial cables is configured to receive an amplified radio frequency signal from a respective one of the N radio frequency power amplifiers;
a board comprising a plurality of capacitances and configured to connect to each of the N coaxial cables at respective second ends and combine the amplified radio frequency signals, wherein the N coaxial cables and the plurality of capacitances provide N inductance and capacitance combinations;
a connector configured to connect an output of the board to a load;
wherein each of the N coaxial cables includes:
a sheathed section connected to a coaxial connector, wherein the coaxial connector is configured to connect to one of the N radio frequency power amplifiers;
a shielded section configured to connect to a voltage reference;
a non-shielded section having an inductance; and
a core section connected to the board.

12. The combiner of claim 11, wherein:
the sheathed section comprises a sheath;
the shielded section comprises a shield and does not include the sheath, wherein the shield is configured to connect to the voltage reference via a clamp;
the non-shielded section comprises a dielectric insulator and does not include the sheath and the shield; and
the core section comprises a wire and does not include the sheath, the shield and the dielectric insulator.

13. The combiner of claim 12, wherein:
the dielectric insulator is disposed between the core and the shield in the sheathed section and the shielded section; and
the shield is disposed between the dielectric insulator and the sheath in the sheathed section.

14. The combiner of claim 11, wherein the inductance of each of the non-shielded sections is directly related to a length of the non-shielded sections.

15. The combiner of claim 11, wherein the non-shield section comprises a first one and second one non-shielded section, and a first inductance of the first one of the non-shielded sections is equal to a second inductance of a second one of the non-shielded sections.

16. A combiner comprising:
a first coaxial cable configured to connect to a first output of a first radio frequency power amplifier, wherein the first coaxial cable comprises a first non-shielded section having a first inductance;
a second coaxial cable configured to connect to a second output of a second radio frequency power amplifier, wherein the second coaxial cable comprises a second non-shielded section having a second inductance; and
a board comprising:
a first capacitance connected to the first non-shielded section and providing a first inductance and capacitance combination, and
a second capacitance connected to the second non-shielded section and providing a second inductance and capacitance combination, wherein the second inductance and capacitance combination is equal to the first inductance and capacitance combination.

17. The combiner of claim 16, wherein:
the first coaxial cable comprises
a first sheathed section connected to a first coaxial connector, wherein the first coaxial connector is configured to connect to the first radio frequency power amplifier,
a first shielded section configured to connect to a voltage reference, and
a first core section connected to the board; and
the second coaxial cable comprises
a second sheathed section connected to a second coaxial connector, wherein the second coaxial connector is configured to connect to the second radio frequency power amplifier,
a second shielded section configured to connect to the voltage reference, and
a second core section connected to the board.

18. The combiner of claim 17, wherein:
the first sheathed section comprises a first sheath;
the second sheathed section comprises a second sheath;
the first shielded section comprises a first shield and does not include the first sheath;
the second shielded section comprises a second shield and does not include the second sheath;
the first shield and the second shield are configured to connect to the voltage reference via a clamp;
the first non-shielded section comprises a first dielectric insulator and does not include the first sheath and the first shield;
the second non-shielded section comprises a second dielectric insulator and does not include the second sheath and the second shield;
the first core section comprises a first wire and does not include the first sheath, the first shield and the first dielectric insulator; and
the second core section comprises a second wire and does not include the second sheath, the second shield and the second dielectric insulator.

19. The combiner of claim 16, wherein:
a first gain of the first coaxial cable matches a second gain of the second coaxial cable; and
a first phase of the first coaxial cable matches a second phase of the second coaxial cable.

20. The combiner of claim 16, wherein:
a first impedance of the first coaxial cable matches an impedance of an output of the first radio frequency power amplifier;
a second impedance of the second coaxial cable matches an impedance of an output of the second radio frequency power amplifier; and
a third impedance of an output of the board matches an impedance of an input of a load, wherein the output of the board is configured to connect to the input of the load via a connector.

* * * * *